US010699996B2

(12) United States Patent
Kim

(10) Patent No.: US 10,699,996 B2
(45) Date of Patent: Jun. 30, 2020

(54) FAN-OUT SEMICONDUCTOR PACKAGE

(71) Applicant: SAMSUNG ELECTRONICS CO., LTD., Suwon-si (KR)

(72) Inventor: Bong Soo Kim, Suwon-Si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 16/037,724

(22) Filed: Jul. 17, 2018

(65) Prior Publication Data
US 2019/0189550 A1    Jun. 20, 2019

(30) Foreign Application Priority Data
Dec. 20, 2017   (KR) .................. 10-2017-0176280

(51) Int. Cl.
H01L 23/498    (2006.01)
H01L 23/528    (2006.01)
H01L 23/49     (2006.01)
H01L 23/538    (2006.01)
H01L 23/00     (2006.01)
H01L 23/31     (2006.01)
H05K 1/18      (2006.01)

(52) U.S. Cl.
CPC ........ H01L 23/49838 (2013.01); H01L 23/49 (2013.01); H01L 23/49811 (2013.01); H01L 23/49827 (2013.01); H01L 23/528 (2013.01); H01L 23/5389 (2013.01); H01L 24/20 (2013.01); H05K 1/185 (2013.01); H01L 23/3128 (2013.01); H01L 23/562 (2013.01); H01L 24/02 (2013.01); H01L 24/05 (2013.01);
(Continued)

(58) Field of Classification Search
None
See application file for complete search history.

(56) References Cited

U.S. PATENT DOCUMENTS 9,685,350 B2    6/2017  Lin et al.
2007/0096292 A1 5/2007  Machida
(Continued)

FOREIGN PATENT DOCUMENTS

KR  10-2011-0092045 A    8/2011
KR  10-2014-0030903 A    3/2014
(Continued)

OTHER PUBLICATIONS

Korean Office Action dated Nov. 14, 2018 issued in Korean Patent Application No. 10-2017-0176280 (with English translation).
(Continued)

Primary Examiner — Jay C Chang
(74) Attorney, Agent, or Firm — Sughrue Mion, PLLC

(57) ABSTRACT

A fan-out semiconductor package includes: a core member having a through-hole; a semiconductor chip disposed in the through-hole of the core member and having an active surface having connection pads disposed thereon and an inactive surface opposing the active surface; an encapsulant covering at least portions of the core member and the semiconductor chip and filling at least portions of the through-hole; and a connection member disposed on the core member and the active surface of the semiconductor chip and including a redistribution layer electrically connected to the connection pads. The core member has a recess portion penetrating through at least portions of the core member, and at least a portion of the recess portion is filled with the encapsulant.

18 Claims, 13 Drawing Sheets

(52) U.S. Cl.
CPC ............... *H01L 24/13* (2013.01); *H01L 24/16* (2013.01); *H01L 24/32* (2013.01); *H01L 2224/02311* (2013.01); *H01L 2224/02377* (2013.01); *H01L 2224/0401* (2013.01); *H01L 2224/04105* (2013.01); *H01L 2224/05569* (2013.01); *H01L 2224/12105* (2013.01); *H01L 2224/131* (2013.01); *H01L 2224/13111* (2013.01); *H01L 2224/13147* (2013.01); *H01L 2224/16145* (2013.01); *H01L 2224/16227* (2013.01); *H01L 2224/215* (2013.01); *H01L 2224/32225* (2013.01); *H01L 2224/73204* (2013.01); *H01L 2924/15311* (2013.01); *H01L 2924/181* (2013.01); *H01L 2924/19106* (2013.01)

(56) References Cited

U.S. PATENT DOCUMENTS

| | | |
|---|---|---|
| 2009/0160071 A1 | 6/2009 | Shen |
| 2011/0193228 A1 | 8/2011 | Yu et al. |
| 2017/0103951 A1 | 4/2017 | Lee et al. |
| 2017/0110413 A1 | 4/2017 | Chen et al. |
| 2017/0133309 A1 | 5/2017 | Kim et al. |
| 2017/0178789 A1* | 6/2017 | Kim ............... H01F 27/2804 |
| 2017/0309571 A1* | 10/2017 | Yi ............... H01L 23/5389 |
| 2017/0358535 A1* | 12/2017 | Yoo ............... H01L 21/4853 |

FOREIGN PATENT DOCUMENTS

| | | |
|---|---|---|
| KR | 10-2017-0043427 A | 4/2017 |
| KR | 10-2017-0043440 A | 4/2017 |
| KR | 10-2017-0054875 A | 5/2017 |
| TW | 200742521 A | 11/2007 |
| TW | 201724387 A | 7/2017 |

OTHER PUBLICATIONS

Communication dated Apr. 8, 2019, issued by the Taiwan Patent Office in counterpart Taiwan Application No. 107124884.
Communication dated May 22, 2019, issued by the Korean Patent Office in counterpart Korean Application No. 10-2017-0176280.

* cited by examiner

FAN-OUT SEMICONDUCTOR PACKAGE

CROSS-REFERENCE TO RELATED APPLICATION(S)

This application claims benefit of priority to Korean Patent Application No. 10-2017-0176280 filed on Dec. 20, 2017 in the Korean Intellectual Property Office, the disclosure of which is incorporated herein by reference in its entirety.

TECHNICAL FIELD

The present disclosure relates to a semiconductor package, and more particularly, to a fan-out semiconductor package in which electrical connection structures may extend outwardly of a region in which a semiconductor chip is disposed.

BACKGROUND

A significant recent trend in the development of technology related to semiconductor chips has been reductions in the size of semiconductor chips. Therefore, in the field of package technology, in accordance with a rapid increase in demand for small-sized semiconductor chips, or the like, the implementation of a semiconductor package, having a compact size while including a plurality of pins, has been demanded.

One type of semiconductor package technology suggested to satisfy the technical demand, described above, is a fan-out semiconductor package. Such a fan-out package has a compact size and may allow a plurality of pins to be implemented by redistributing electrical connection structures outwardly of a region in which a semiconductor chip is disposed.

SUMMARY

An aspect of the present disclosure may provide a fan-out semiconductor package of which warpage may be effectively controlled.

According to an aspect of the present disclosure, a fan-out semiconductor package may be provided, in which a core member having a through-hole is introduced in a region in which a semiconductor chip is disposed, the semiconductor chip is disposed in the through-hole, recess portions having a blind form are formed in the core member, and the recess portions of the core member are filled with the encapsulant at the time of encapsulating the semiconductor chip to control warpage of the fan-out semiconductor chip.

According to an aspect of the present disclosure, a fan-out semiconductor package may include: a core member having a through-hole; a semiconductor chip disposed in the through-hole of the core member and having an active surface having connection pads disposed thereon and an inactive surface opposing the active surface; an encapsulant covering at least portions of the core member and the semiconductor chip and filling at least portions of the through-hole; and a connection member disposed on the core member and the active surface of the semiconductor chip and including a redistribution layer electrically connected to the connection pads. The core member may have a recess portion penetrating through at least portions of the core member, and at least a portion of the recess portion may be filled with the encapsulant.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Herein, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
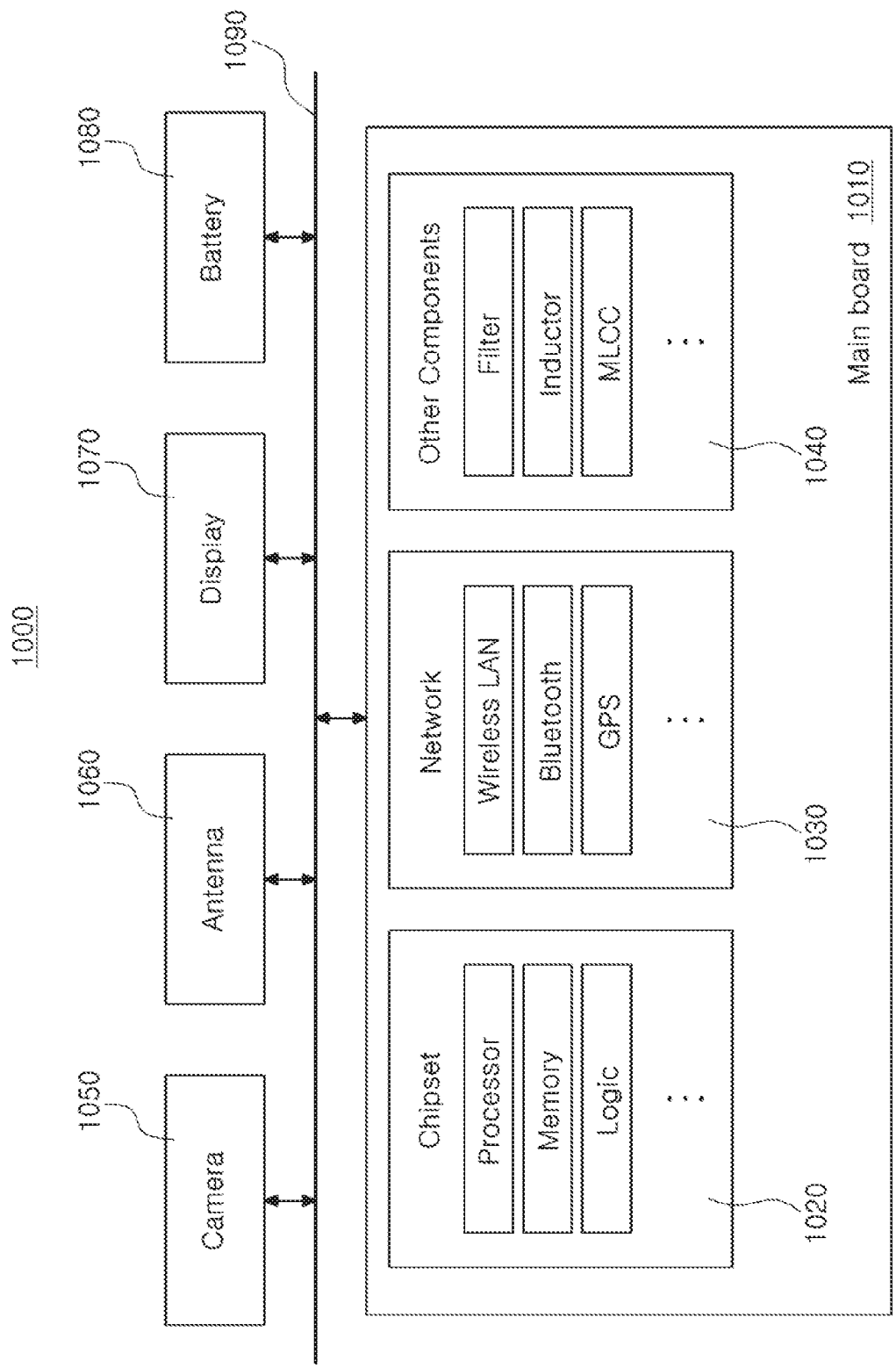
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
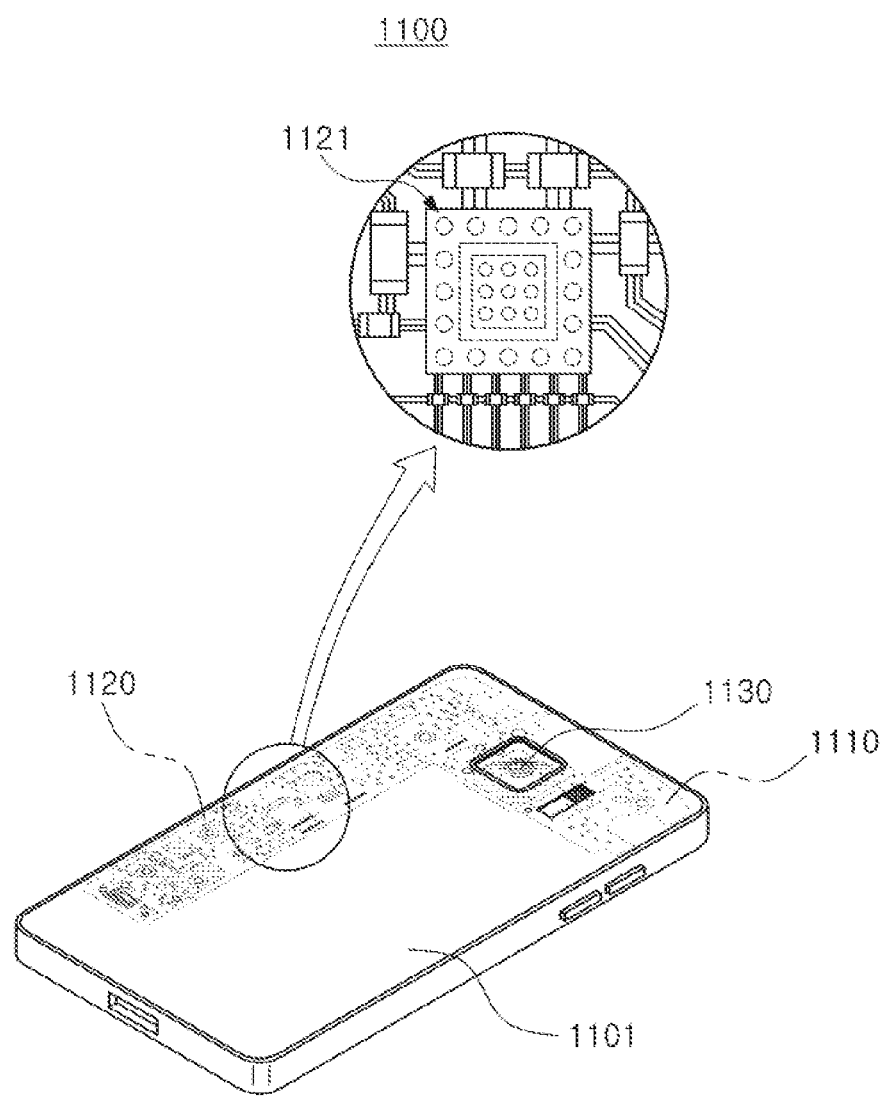
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the mainboard 1010, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3B:
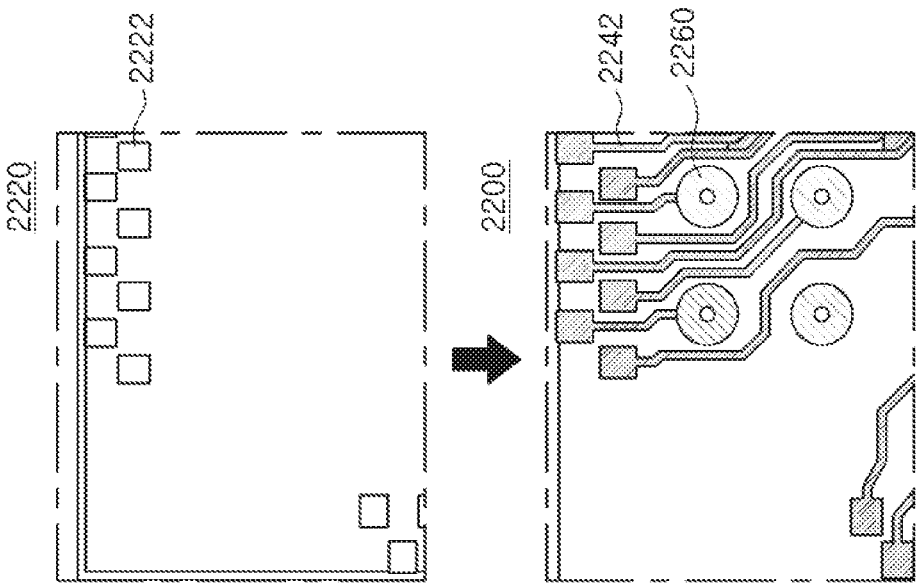
FIGS. 3A and 3B are schematic cross-sectional views illustrating states of a fan-in semiconductor package before and after being packaged.
Figure 3A:
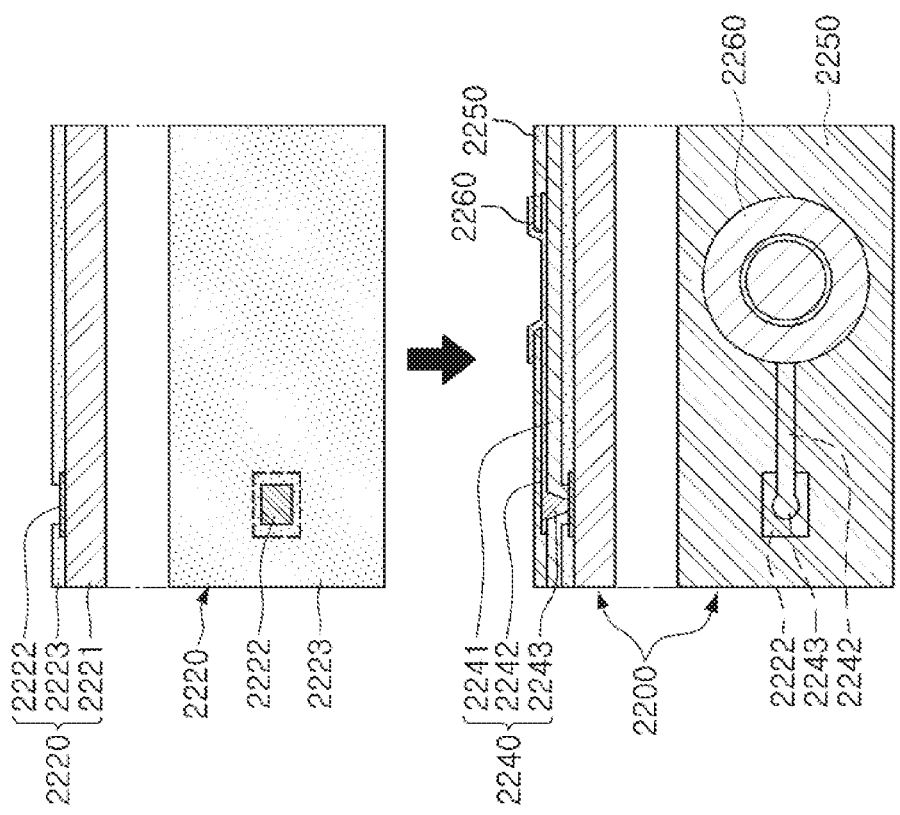

FIGS. 3A and 3B are schematic cross-sectional views illustrating states of a fan-in semiconductor package before and after being packaged.

Figure 4:
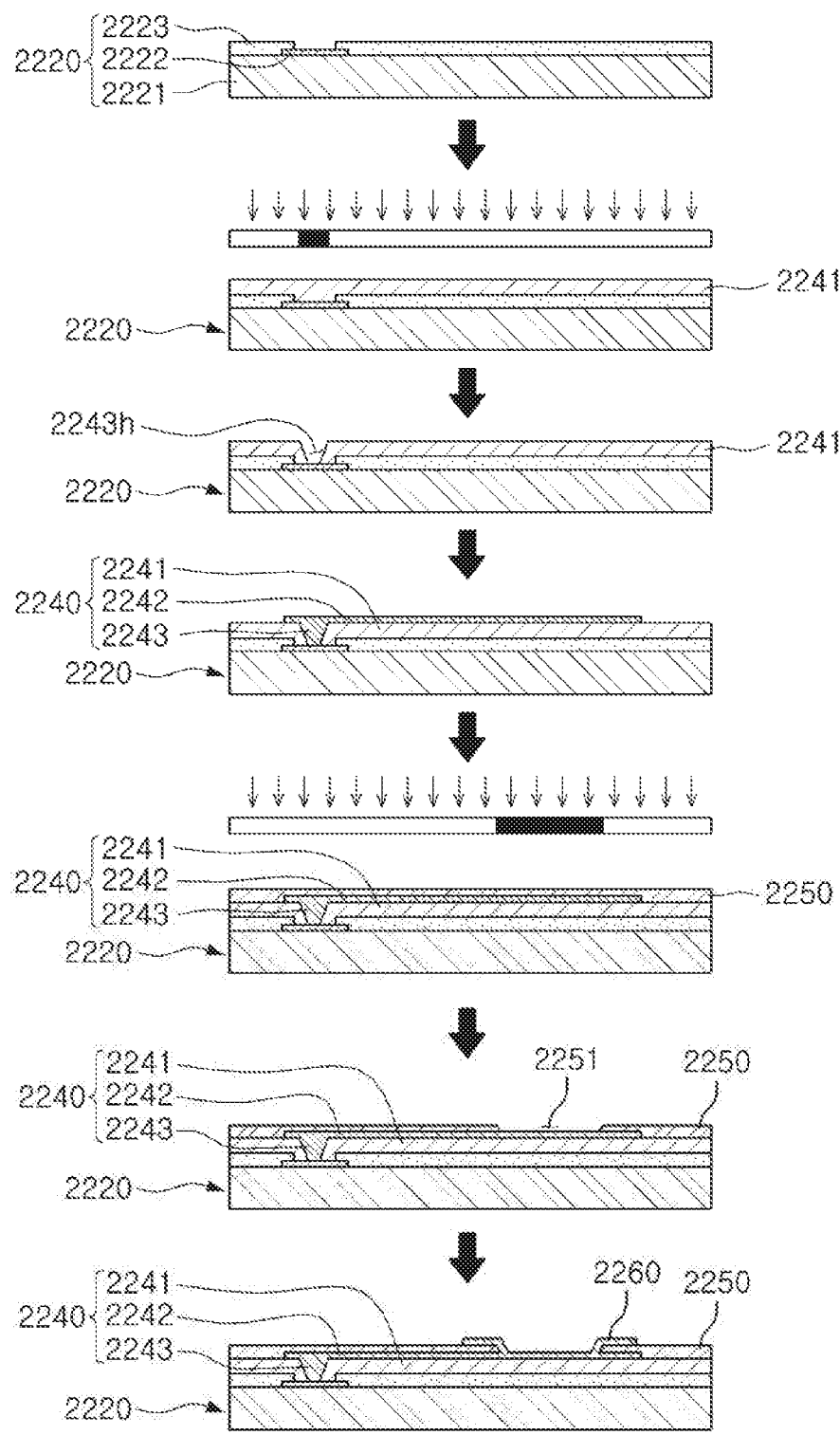
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3 and 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device.

The reason is that even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
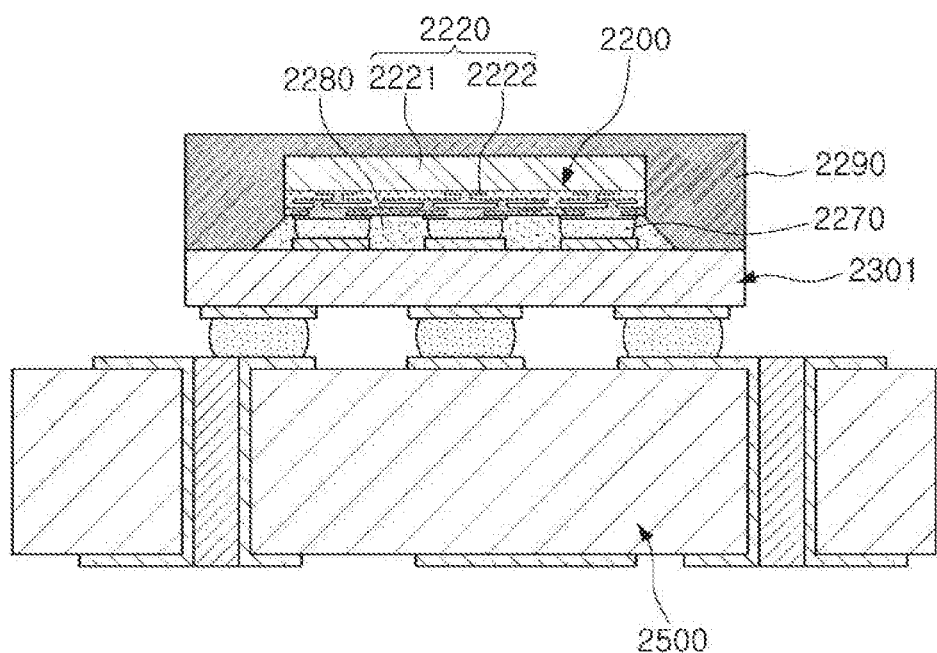
FIG. 5 is a schematic cross-sectional view illustrating a case in which a fan-in semiconductor package is mounted on a ball grid array (BGA) substrate and is ultimately mounted on a mainboard of an electronic device.

FIG. 5 is a schematic cross-sectional view illustrating a case in which a fan-in semiconductor package is mounted on a ball grid array (BGA) substrate and is ultimately mounted on a mainboard of an electronic device.

Figure 6:
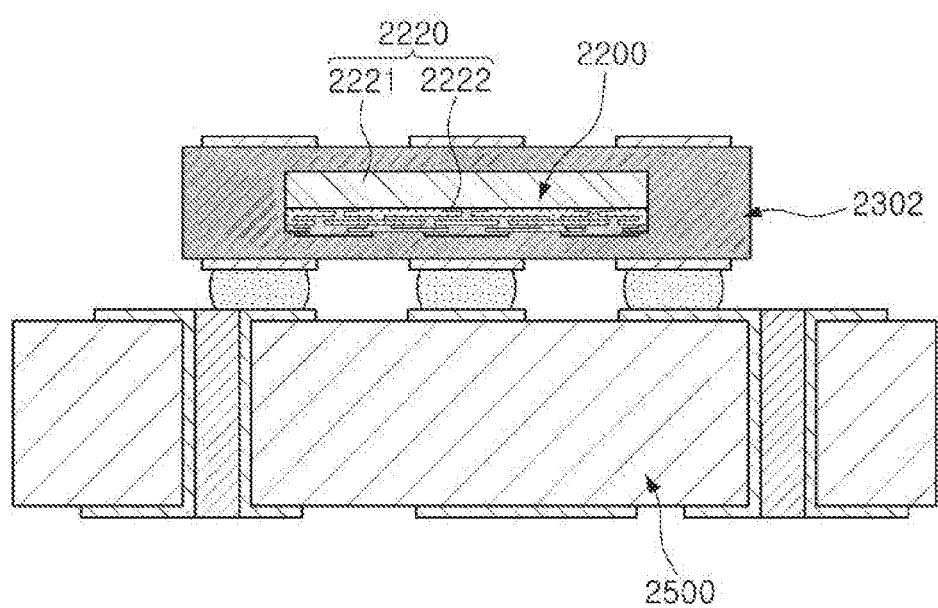
FIG. 6 is a schematic cross-sectional view illustrating a case in which a fan-in semiconductor package is embedded in a BGA substrate and is ultimately mounted on a mainboard of an electronic device.

FIG. 6 is a schematic cross-sectional view illustrating a case in which a fan-in semiconductor package is embedded in a BGA substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through a BGA substrate 2301, and the fan-in semiconductor package 2200 may be ultimately mounted on a mainboard 2500 of an electronic device in a state in which it is mounted on the BGA substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate BGA substrate 2302, connection pads 2222, that is, I/O terminals, of the semiconductor chip 2220 may be redistributed by the BGA substrate 2302 in a state in which the fan-in semiconductor package 2200 is embedded in the BGA substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate BGA substrate and be then mounted on the mainboard of the electronic device through a packaging process or may be mounted and used on the mainboard of the electronic device in a state in which it is embedded in the BGA substrate.

Fan-Out Semiconductor Package

Figure 7:
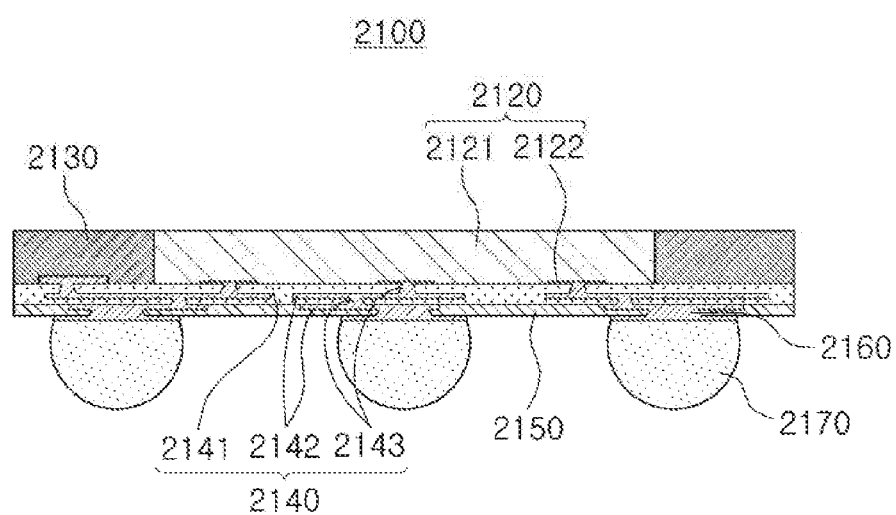
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the mainboard of the electronic device without using a separate BGA substrate, as described below.

Figure 8:
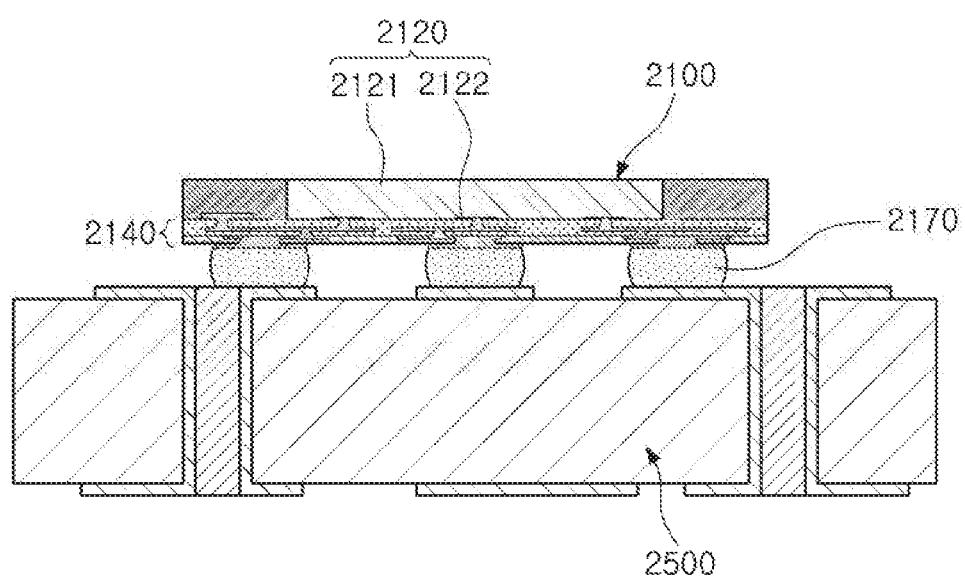
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate BGA substrate, or the like.

As described above, since the fan-out semiconductor package may be mounted on the mainboard of the electronic device without using the separate BGA substrate, the fan-out semiconductor package may be implemented at a thickness lower than that of the fan-in semiconductor package using the BGA substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as a BGA substrate, or the like, having a scale, a purpose, and the like, different from those of the fan-out semiconductor package, and having the fan-in semiconductor package embedded therein.

A fan-out semiconductor package of which warpage may be effectively controlled will hereinafter be described with reference to the drawings.

Figure 9:
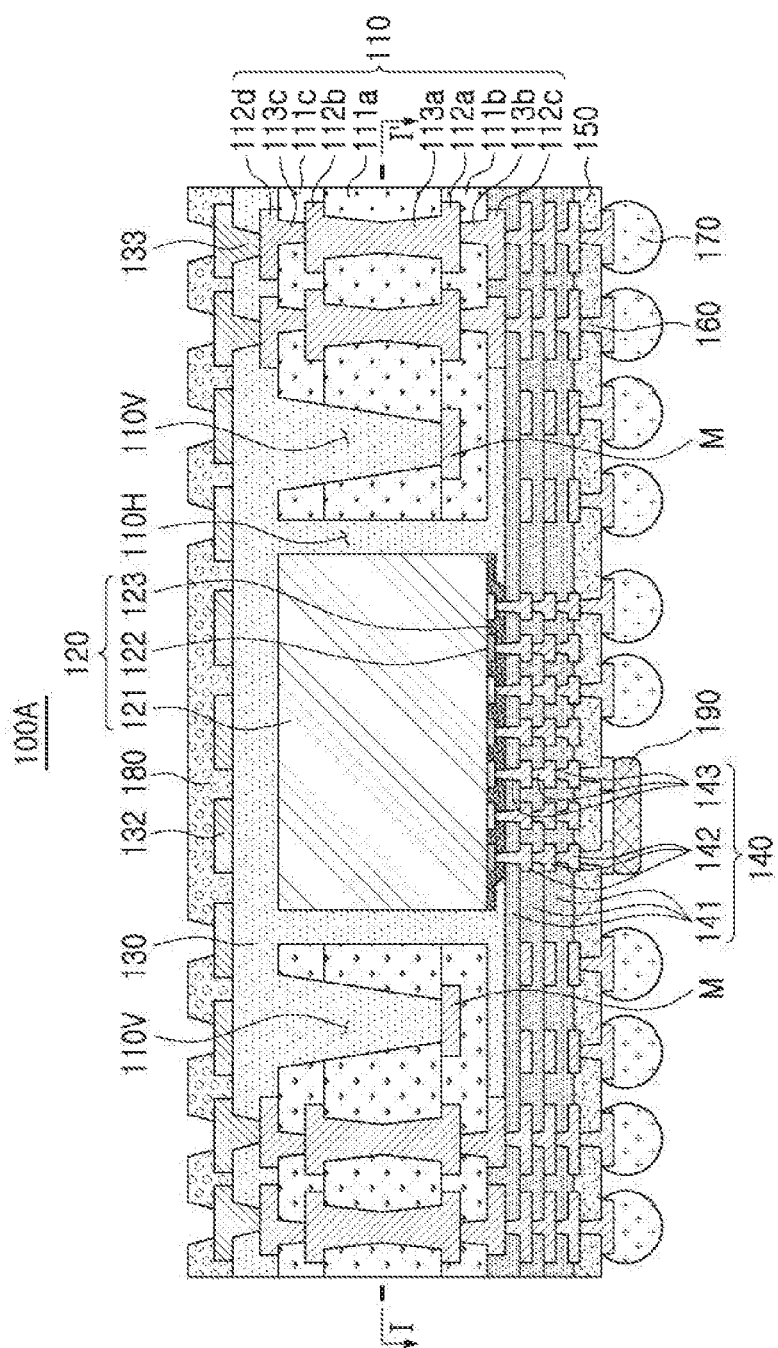
FIG. 9 is a schematic cross-sectional view illustrating an example of a fan-out semiconductor package.

FIG. 9 is a schematic cross-sectional view illustrating an example of a fan-out semiconductor package.

Figure 10:
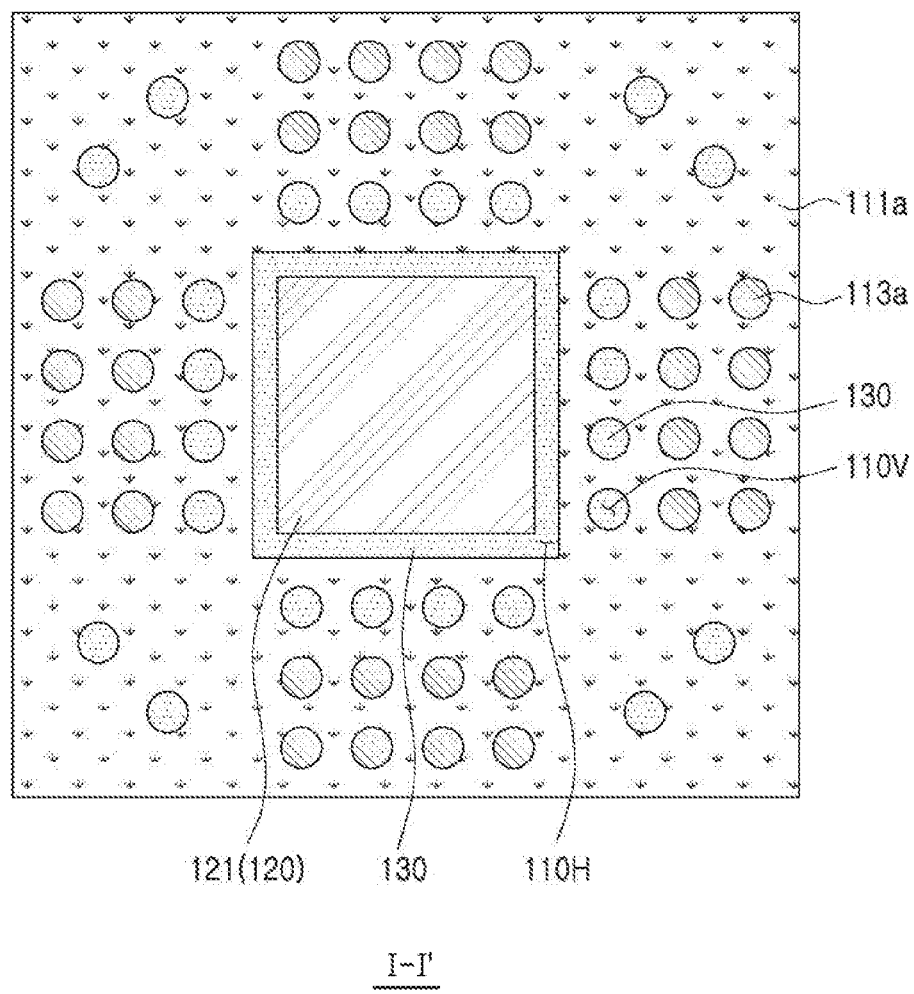
FIG. 10 is a schematic plan view taken along line I-I' of the fan-out semiconductor package of FIG. 9.

FIG. 10 is a schematic plan view taken along line I-I' of the fan-out semiconductor package of FIG. 9.

Figure 11:
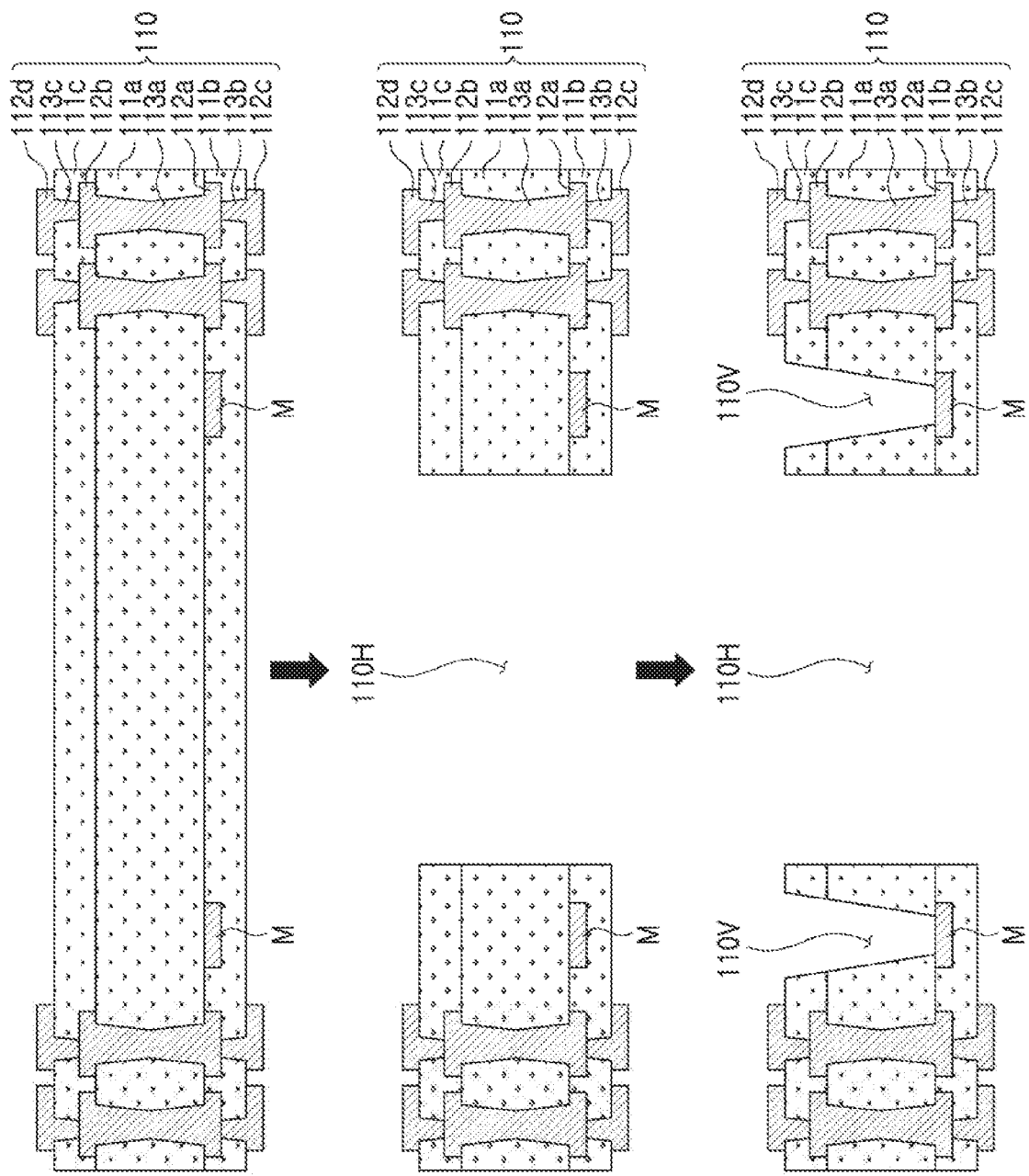
FIG. 11 is schematic views illustrating processes of manufacturing a core member of the fan-out semiconductor package of FIG. 9.

FIG. 11 is schematic views illustrating processes of manufacturing a core member of the fan-out semiconductor package of FIG. 9.

Referring to FIGS. 9 through 11, a fan-out semiconductor package 100A according to an exemplary embodiment in the present disclosure may include a core member 110 having a through-hole 110H and a plurality of recess portions 110V formed in the vicinity of the through-hole 110H, each of the plurality of recess portions 110V having a first surface closed by a barrier layer M and a second surface opposing the first surface and being opened; a semiconductor chip 120 disposed in the through-hole 110H of the core member 110 and having an active surface having connection pads 122 disposed thereon and an inactive surface opposing the active surface; an encapsulant 130 covering at least portions of the core member 110 and the semiconductor chip 120 and filling at least portions of the through-hole 110H and the recess portions 110V; and a connection member 140 disposed on the core member 110 and the active surface of the semiconductor chip 120 and including a redistribution layer 142 electrically connected to the connection pads 122.

In the fan-out semiconductor package 100A according to the exemplary embodiment, the core member 110 may be introduced to effectively control warpage of the fan-out semiconductor package 100A. In addition, a plurality of wiring layers 112a, 112b, 112c, and 112d formed of a conductive material are formed in the core member 110, and rigidity of the fan-out semiconductor package 100A may thus be more effectively maintained. Particularly, the plurality of recess portions 110V may be formed, in addition to the through-hole 110H in which the semiconductor chip 120 is disposed, in the core member 110, and may be filled with the encapsulant 130. The recess portions 110V are filled with the encapsulant 130, such that a thickness of the encapsulant 130 and warpage of the fan-out semiconductor package may be finely controlled. That is, the warpage of the fan-out semiconductor package may be finely controlled by controlling a volume of the encapsulant 130 through the recess portions 110V formed in the core member 110.

Meanwhile, the through-hole 110H and the recess portions 110V of the core member 110 may be formed by a laser drill, a mechanical drill, or a sandblast. For example, the core member 110 in which the through-hole 110H and the recess portions 110V are not formed may be formed using a copper clad laminate (CCL), a build-up film (Ajinomoto build-up film (ABF)), a plating process, and the like, the through-hole 110H may be formed in the core member 110 by the laser drill, the mechanical drill, or the sandblast, and the recess portions 110V may then be formed by $CO_2$ laser drill, or the like, using the barrier layer M as a stopper layer. After the through-hole 110H and the recess portions 110V are drilled, a desmear process may be performed. When a metal layer is used as the barrier layer M, the barrier layer M may be formed together with a first wiring layer 112a when the first wiring layer 112a is formed by a plating process. Thus, the barrier layer M may have a surface coplanar with a surface of the first wiring layer 112a.

The respective components included in the fan-out semiconductor package 100A according to the exemplary embodiment will hereinafter be described in more detail.

The core member 110 may improve rigidity of the fan-out semiconductor package 100A depending on certain materials, and serve to secure uniformity of a thickness of the encapsulant 130. When the wiring layers 112a, 112b, 112c, and 112d, vias 113a, 113b, and 113c, and the like, are formed in the core member 110, the fan-out semiconductor package 100A may be utilized as a package-on-package (POP) type package. The core member 110 may have the through-hole 110H. The semiconductor chip 120 may be disposed in the through-hole 110H to be spaced apart from the core member 110 by a predetermined distance. Side surfaces of the semiconductor chip 120 may be surrounded by the core member 110. The core member 110 may have the recess portions 110V in addition to the through-hole 110H. The recess portions 110V may be formed in order to control the warpage of the fan-out semiconductor package 100A. To this end, at least portions of the recess portions 110V may be filled with the encapsulant 130. The encapsulant 130 may be in direct contact with walls of the recess portions 110V, i.e., side surfaces of the first and third insulating layers 111a and 113c of the core member 110 exposed by the recess portion 110V. The recess portions 110V may be formed using the barrier layer M formed in the core member 110 as the stopper layer. Therefore, a depth of the through-hole 110H may be greater than that of the recess portion 110V. The recess portions 110V may be formed by the laser drill or the mechanical drill using the barrier layer M as the stopper layer. In this case, the walls of the recess portions 110V may have a gradient of an acute angle. That is, the recess portions 110V may have a tapered shape. The number or positions of recess portions 110V are not particularly limited.

The core member 110 may include a first insulating layer 111a, a first wiring layer 112a disposed on a first surface of the first insulating layer 111a, a second wiring layer 112b disposed on a second surface of the first insulating layer 111a, a second insulating layer 111b disposed on the first surface of the first insulating layer 111a and covering the first wiring layer 112a, a third wiring layer 112c disposed on the second insulating layer 111b, a third insulating layer 111c disposed on the second surface of the first insulating layer 111a and covering the second wiring layer 112b, and a fourth wiring layer 112d disposed on the third insulating layer 111c. In addition, the core member 110 may include first vias 113a penetrating through the first insulating layer 111a and electrically connecting the first and second wiring layers 112a and 112b to each other, second vias 113b penetrating through the second insulating layer 111b and electrically connecting the first and third wiring layers 112a and 112c to each other, and third vias 113c penetrating through the third insulating layer 111c and electrically connecting the second and fourth wiring layers 112b and 112d to each other. The first to fourth wiring layers 112a, 112b, 112c, and 112d may be electrically connected to each other, and may be electrically connected to the connection pads 122 of the semiconductor chip 120.

A material of each of the insulating layers 111a, 111b, and 111c is not particularly limited. For example, an insulating material may be used as the material of each of the insulating layers 111a, 111b, and 111c. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, Ajinomoto Build up Film (ABF), FR-4, Bismaleimide Triazine (BT), or the like. Alternatively, a PID resin may also be used as the insulating material.

The wiring layers 112a, 112b, 112c, and 112d may serve to redistribute the connection pads 122 of the semiconductor chip 120. A material of each of the wiring layers 112a, 112b, 112c, and 112d may be a conductive material such as copper (Cu), aluminum (Al), silver (Ag), tin (Sn), gold (Au), nickel (Ni), lead (Pb), titanium (Ti), or alloys thereof. The wiring layers 112a, 112b, 112c, and 112d may perform various functions depending on designs of corresponding layers. For example, the wiring layers 112a, 112b, 112c, and 112d may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the wiring layers 112a, 112b, 112c, and 112d may include via pads, wire pads, electrical connection structure pads, and the like.

The vias 113a, 113b, and 113c may electrically connect the wiring layers 112a, 112b, 112c, and 112d formed on different layers to each other, resulting in an electrical path in the core member 110. A material of each of the vias 113a, 113b, and 113c may be a conductive material. Each of the vias 113a, 113b, and 113c may be completely filled with the conductive material, or the conductive material may also be formed along a wall of each of via holes. Meanwhile, the recess portion 110V may have a diameter greater than that of a hole of each of the vias 113a, 113b, and 113c. Here, the diameter refers to an average diameter, and the reason is that the recess portion 110V has a depth greater than that of the hole of each of the vias 113a, 113b, and 113c.

The barrier layer M may be disposed on the first surface of the first insulating layer 111a, and a first surface of the barrier layer M may be covered by the second insulating layer 111b and at least portions of a second surface of the barrier layer M opposing the first surface of the barrier layer M may be exposed by the recess portion 110V. The recess portion 110V may penetrate through the first and third insulating layers 111a and 111c, but may not penetrate through the second insulating layer 111b. Walls of the recess portions 110V formed in the first and third insulating layers 111a and 111c may have substantially the same gradient. The barrier layer M may be a conductive material including a metal plate including copper (Cu), aluminum (Al), silver (Ag), tin (Sn), gold (Au), nickel (Ni), lead (Pb), titanium (Ti), or alloys thereof, similar to the wiring layers 112a, 112b, 112c, and 112d. However, the barrier layer M is not limited thereto, but may also include, for example, an insulating material. In more detail, the barrier layer M may be, for example, a dry film photo-resist (DFR) including a photosensitive polymer. Meanwhile, the barrier layer M may perform a role similar to those of the wiring layers 112a, 112b, 112c, and 112d described above, if necessary. For example, the barrier layer M may be a ground face or a power face. Alternatively, the barrier layer M may be electrically floating and electrically insulated from the wiring layers 112a, 112b, 112c, and 112d. The recess portion 110V and the barrier layer M may be disposed in a region of the core member 110 between the through-hole 110H and a region of the core member 110 in which the vias 113a and 113c are disposed. No vias or no wiring layers may be disposed in a region of the core member 110 between the recess portion 110V and the barrier layer M, and the through-hole 110.

The first insulating layer 111a may have a thickness greater than those of the second insulating layer 111b and the third insulating layer 111c. The first insulating layer 111a may be basically relatively thick in order to maintain rigidity, and the second insulating layer 111b and the third insulating layer 111c may be introduced in order to form a larger number of wiring layers 112c and 112d. The first insulating layer 111a may include an insulating material different from those of the second insulating layer 111b and the third insulating layer 111c. For example, the first insulating layer 111a may be, for example, prepreg including a core material, a filler, and an insulating resin, and the second insulating layer 111b and the third insulating layer 111c may be an ABF or a PID film including a filler and an insulating resin. However, the materials of the first insulating layer 111a and the second and third insulating layers 111b and 111c are not limited thereto. Similarly, the first vias 113a penetrating through the first insulating layer 111a may have a diameter greater than those of second vias 113b and third vias 113c respectively penetrating through the second insulating layer 111b and the third insulating layer 111c.

A lower surface of the third wiring layer 112c of the core member 110 may be disposed on a level above a lower surface of the connection pad 122 of the semiconductor chip 120. In addition, a distance between the redistribution layer 142 of the connection member 140 and the third wiring layer 112c of the core member 110 may be smaller than that between the redistribution layer 142 of the connection member 140 and the connection pad 122 of the semiconductor chip 120. The reason is that the third wiring layer 112c may be disposed on the second insulating layer 111b in a protruding form, resulting in being in contact with the connection member 140. The first wiring layer 112a and the second wiring layer 112b of the core member 110 may be disposed on a level between the active surface and the inactive surface of the semiconductor chip 120. Thicknesses of the wiring layers 112a, 112b, 112c, and 112d of the core member 110 may be greater than that of the redistribution layer 142 of the connection member 140. The first vias 113a may have a hourglass shape, and the second and third vias 113b and 113c may have tapered shapes of which directions are opposite to each other.

The semiconductor chip 120 may be an integrated circuit (IC) provided in an amount of several hundred to several million or more elements integrated in a single chip. In this case, the IC may be, for example, a processor chip (more specifically, an application processor (AP)) such as a central processor (for example, a CPU), a graphic processor (for example, a GPU), a field programmable gate array (FPGA), a digital signal processor, a cryptographic processor, a micro processor, a micro controller, or the like, but is not limited thereto.

The semiconductor chip 120 may be formed on the basis of an active wafer. In this case, a base material of a body 121 may be silicon (Si), germanium (Ge), gallium arsenide (GaAs), or the like. Various circuits may be formed on the body 121. The connection pads 122 may electrically connect the semiconductor chip 120 to other components. A material of each of the connection pads 122 may be a conductive material such as aluminum (Al), or the like. A passivation layer 123 exposing the connection pads 122 may be formed on the body 121, and may be an oxide film, a nitride film, or the like, or a double layer of an oxide layer and a nitride layer. The lower surface of the connection pad 122 may have a step with respect to a lower surface of the encapsulant 130 through the passivation layer 123. Therefore, the encapsulant 130 may fill at least portions of a space between the passivation layer 123 and the connection member 140. In this case, a phenomenon that the encapsulant 130 bleeds into the lower surface of the connection pad 122 may be prevented to some degree. An insulating layer (not illustrated), and the like, may also be further disposed in other required positions. The semiconductor chip 120 may be a bare die. Therefore, the connection pads 122 may be in physical contact with the vias 143 of the connection member 140. However, when the semiconductor chip 120 is not an application processor (AP), a separate redistribution layer (not illustrated) may further be formed on the active surface of the semiconductor chip 120, and bumps (not illustrated), or the like, may be connected to the connection pads 122.

The encapsulant 130 may protect the core member 110, the semiconductor chip 120, and the like. An encapsulation form of the encapsulant 130 is not particularly limited, but may be a form in which the encapsulant 130 surrounds at least portions of the core member 110, the semiconductor chip 120, and the like. For example, the encapsulant 130 may cover at least portions of the core member 110 and the semiconductor chip 120, and fill at least portions of the through-hole 110H and the recess portions 110V. Meanwhile, the encapsulant 130 may fill the through-hole 110H to thus serve as an adhesive and reduce buckling of the semiconductor chip 120 depending on certain materials. The encapsulant 130 may fill the recess portions 110V to more effectively control the warpage of the fan-out semiconductor package.

A material of the encapsulant 130 is not particularly limited. For example, an insulating material may be used as the material of the encapsulant 130. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a photoimagable encapsulant (PIE) resin may also be used as the insulating material.

A backside wiring layer 132 may be disposed on the encapsulant 130. The backside wiring layer 132 may be electrically connected to the wiring layer 112d of the core member 110 through backside vias 133 penetrating through the encapsulant 130. A material of the backside wiring layer 132 may be a conductive material such as copper (Cu), aluminum (Al), silver (Ag), tin (Sn), gold (Au), nickel (Ni), lead (Pb), titanium (Ti), or alloys thereof. The backside wiring layer 132 may perform various functions depending on a design. For example, the backside wiring layer 132 may include ground (GND) patterns, power (PWR) patterns, signal (S) patterns, and the like. The backside via 133 may have a tapered shape, similar to the vias 113a, 113b, and 113c of the core member 110.

The connection member 140 may redistribute the connection pads 122 of the semiconductor chip 120. Several tens to several hundreds of connection pads 122 of the semiconductor chip 120 having various functions may be redistributed by the connection member 140, and may be physically or electrically externally connected through electrical connection structures 170 depending on the functions. The connection member 140 may include insulating layers 141 disposed on the core member 110 and the active surface of the semiconductor chip 120, redistribution layers 142 disposed on the insulating layers 141, and vias 143 penetrating through the insulating layers 141 and connecting the connection pads 122 and the redistribution layers 142 to each other. A case in which the connection member 140 includes a plurality of insulating layers, a plurality of redistribution layers, and a plurality of via layers is illustrated in the drawings, but the connection member 140 may include smaller numbers or larger numbers of insulating layers, redistribution layers, and via layers than those illustrated in the drawings depending on a design.

A material of each of the insulating layers 141 may be an insulating material. In this case, a photosensitive insulating material such as a PID resin may also be used as the insulating material. That is, each of the insulating layers 141 may be a photosensitive insulating layer. When the insulating layer 141 has photosensitive properties, the insulating layer 141 may be formed to have a smaller thickness, and a fine pitch of the via 143 may be achieved more easily. Each of the insulating layers 141 may be a photosensitive insulating layer including an insulating resin and an inorganic filler. When the insulating layers 141 are multiple layers, materials of the insulating layers 141 may be the same as each other, and may also be different from each other, if necessary. When the insulating layers 141 are the multiple layers, the insulating layers 141 may be integrated with each other depending on a process, such that a boundary therebetween may also not be apparent.

The redistribution layers 142 may substantially serve to redistribute the connection pads 122. A material of each of the redistribution layers 142 may be a conductive material such as copper (Cu), aluminum (Al), silver (Ag), tin (Sn), gold (Au), nickel (Ni), lead (Pb), titanium (Ti), or alloys thereof. The redistribution layers 142 may perform various functions depending on designs of corresponding layers. For example, the redistribution layers 142 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 142 may include various pad patterns 142a and 142b. Only the pad patterns 142a and 142b are illustrated as the redistribution layers 142 in the drawings, but patterns such as the ground patterns, the power patterns, the signal patterns, and the like, as described above may be designed in a line form or a plane form as the redistribution layers 142.

The vias 143 may electrically connect the redistribution layers 142, the connection pads 122, and the like, formed on different layers to each other, resulting in an electrical path in the fan-out semiconductor package 100A. A material of each of the vias 143 may be a conductive material such as copper (Cu), aluminum (Al), silver (Ag), tin (Sn), gold (Au), nickel (Ni), lead (Pb), titanium (Ti), or alloys thereof. Each of the vias 143 may be completely filled with the conductive material, or the conductive material may also be formed along a wall of each of the vias. Meanwhile, each of the vias 143 of the connection member 140 may have a tapered shape of which a direction is opposite to that of each of the vias 113a, 113b, and 113c of the core member 110. The vias 143 may be in direct physical contact with the connection pads 122.

A passivation layer 150 may be disposed on the connection member 140. The passivation layer 150 may protect the connection member 140 from external physical or chemical damage. The passivation layer 150 may have openings exposing at least portions of the redistribution layer 142 of the connection member 140. The number of openings formed in the passivation layer 150 may be several tens to several thousands. A surface treatment layer may be formed on a surface of the exposed redistribution layer 142. A material of the passivation layer 150 is not particularly limited. For example, an insulating material may be used as the material of the passivation layer 150. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a solder resist may also be used.

Underbump metal layers 160 may be disposed in the openings of the passivation layer 150. The underbump metal layers 160 may improve connection reliability of the electrical connection structures 170 to improve board level reliability of the fan-out semiconductor package 100A. The underbump metal layers 160 may be connected to the redistribution layer 142 of the connection member 140 exposed through the openings of the passivation layer 150. The underbump metal layers 160 may be formed in the openings of the passivation layer 150 by any known metallization method using any known conductive material such as a metal, but are not limited thereto.

The electrical connection structures 170 may be disposed on the passivation layer 150. The electrical connection structures 170 may physically or electrically externally connect the fan-out semiconductor package 100A. For example, the fan-out semiconductor package 100A may be mounted on the mainboard of the electronic device through the electrical connection structures 170. Each of the electrical connection structures 170 may be formed of a low melting point metal, for example, a solder such as tin (Sn)-aluminum (Al)-copper (Cu), or the like. However, this is only an example, and a material of each of the electrical connection structures 170 is not particularly limited thereto. Each of the electrical connection structures 170 may be a land, a ball, a pin, or the like. The electrical connection structures 170 may be formed as a multilayer or single layer structure. When the electrical connection structures 170 are formed as a multilayer structure, the electrical connection structures 170 may include a copper (Cu) pillar and a solder. When the electrical connection structures 170 are formed as a single layer structure, the electrical connection structures 170 may include a tin-silver solder or copper (Cu). However, this is only an example, and the electrical connection structures 170 are not limited thereto.

The number, an interval, a disposition form, and the like, of electrical connection structures 170 are not particularly limited, but may be sufficiently modified depending on design particulars by those skilled in the art. For example, the electrical connection structures 170 may be provided in an amount of several tens to several thousands according to the number of connection pads 122, or may be provided in an amount of several tens to several thousands or more or several tens to several thousands or less. When the electrical connection structures 170 are solder balls, the electrical connection structures 170 may cover side surfaces of the underbump metal layers 160 extending onto one surface of the passivation layer 150, and connection reliability may be more excellent.

At least one of the electrical connection structures 170 may be disposed in a fan-out region. The fan-out region refers to a region except for a region in which the semiconductor chip 120 is disposed. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

The respective electrical connection structures 170 may have the same size. Here, the term "same size" does not only mean that sizes are completely the same as each other, but also means that sizes are substantially the same as each other. A pitch between electrical connection structures 170b disposed on the second region B in which stress is concentrated may be smaller than that between electrical connection structures 170a disposed on the first region A in which stress is not concentrated. Resultantly, at least two of the electrical connection structures 170a disposed in the first region A may be in physical contact with each other to form a kind of ball-bridge. Resultantly, stress may be dispersed without changing sizes of balls.

A cover layer 180 may protect the backside wiring layer 132 from external physical or chemical damage. The cover layer 180 may have openings exposing at least portions of the backside wiring layer 132. The number of openings formed in the cover layer 180 may be several tens to several thousands. A surface treatment layer may be formed on a surface of the exposed backside wiring layer 132. A material of the cover layer 180 is not particularly limited. For example, an insulating material may be used as the material of the cover layer 180. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a solder resist may also be used.

A surface mounting component 190 may be mounted on the passivation layer 150 by surface mount technology (SMT), and may be electrically connected to the connection pads 122 of the semiconductor chip 120 through the redistribution layers 142 of the connection member 140. The surface mounting component 190 may be any known passive component such as a capacitor, an inductor, a beads, or the like, but is not limited thereto. In some cases, the surface mounting component 190 may be an integrated circuit (IC) chip.

Meanwhile, although not illustrated in the drawings, a metal thin film may be formed on the walls of the through-hole 110H, if necessary, in order to dissipate heat or block electromagnetic waves. In addition, a plurality of semiconductor chips 120 performing functions that are the same as or different from each other may be disposed in the through-hole 110H, if necessary. In addition, a separate passive component such as an inductor, a capacitor, or the like, may be disposed in the through-hole 110H, if necessary.

Figure 12:
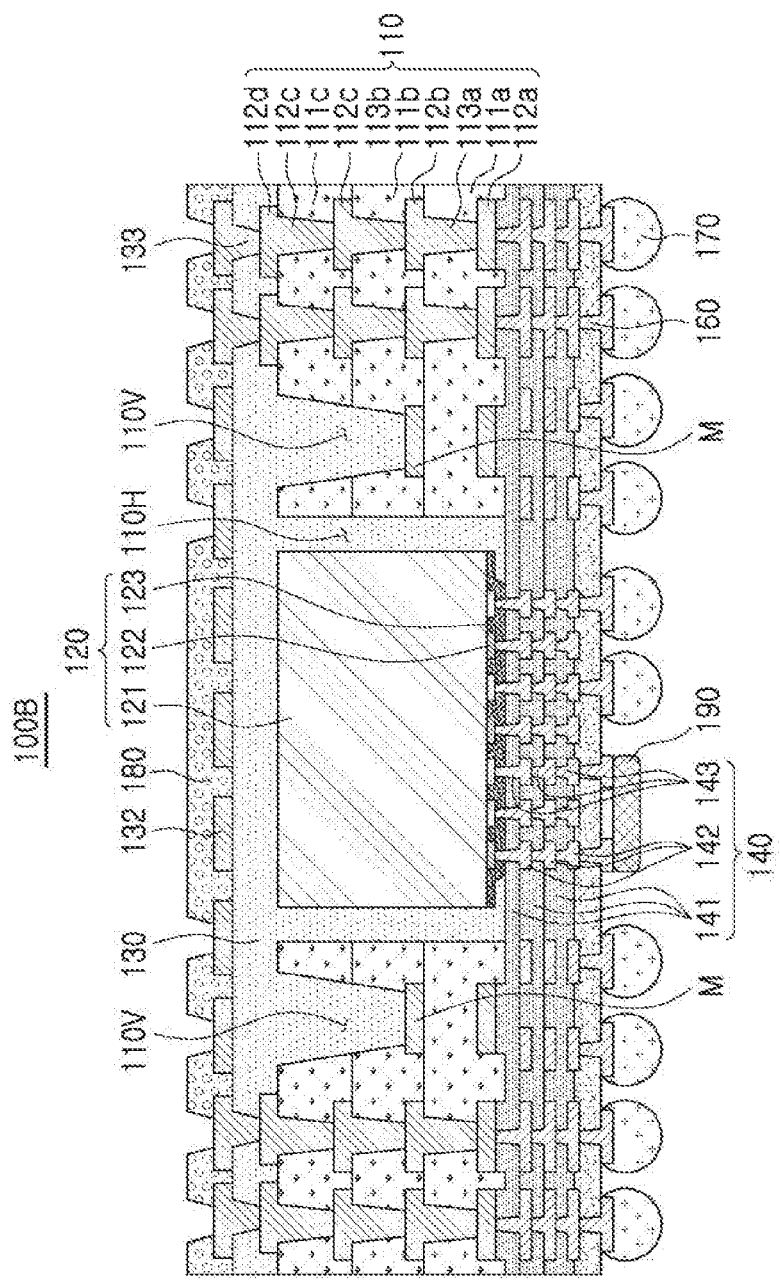
FIG. 12 is a schematic cross-sectional view illustrating another example of a fan-out semiconductor package.

FIG. 12 is a schematic cross-sectional view illustrating another example of a fan-out semiconductor package.

Referring to FIG. 12, in a fan-out semiconductor package 100B according to another exemplary embodiment in the present disclosure, a core member 110 may include a first insulating layer 111a, a first wiring layer 112a embedded in the first insulating layer 111a so that one surface thereof is exposed, a second wiring layer 112b disposed on the other surface of the first insulating layer 111a opposing one surface of the first insulating layer 111a in which the first wiring layer 112a is embedded, a second insulating layer 111b disposed on the first insulating layer 111a and covering the second wiring layer 112b, a third wiring layer 112c disposed on the second insulating layer 111b, a third insulating layer 111c disposed on the second insulating layer 111b and covering the third wiring layer 112c, and a fourth wiring layer 112d disposed on the third insulating layer 111c. The first to fourth wiring layers 112a, 112b, 112c, and 112d may be electrically connected to each other through first to third vias 113a, 113b, and 113c respectively penetrating through the first to third insulating layers 111a, 111b, and 111c, and may be electrically connected to connection pads 122 through redistribution layers 142, or the like.

A material of each of the insulating layers 111a, 111b, and 111c is not particularly limited. For example, an insulating material may be used as the material of each of the insulating layers 111a, 111b, and 111c. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a PID resin may also be used as the insulating material.

The wiring layers 112a, 112b, 112c, and 112d may serve to redistribute the connection pads 122 of a semiconductor chip 120. A material of each of the wiring layers 112a, 112b, 112c, and 112d may be a conductive material such as copper (Cu), aluminum (Al), silver (Ag), tin (Sn), gold (Au), nickel (Ni), lead (Pb), titanium (Ti), or alloys thereof. The wiring layers 112a, 112b, 112c, and 112d may perform various functions depending on designs of corresponding layers. For example, the wiring layers 112a, 112b, 112c, and 112d may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the wiring layers 112a, 112b, 112c, and 112d may include via pads, wire pads, electrical connection structure pads, and the like.

The vias 113a, 113b, and 113c may electrically connect the wiring layers 112a, 112b, 112c, and 112d formed on different layers to each other, resulting in an electrical path in the core member 110. A material of each of the vias 113a, 113b, and 113c may be a conductive material. Each of the vias 113a, 113b, and 113c may be completely filled with the conductive material, or the conductive material may also be formed along a wall of each of via holes. Meanwhile, all the vias 113a, 113b, and 113c may have tapered shapes of which directions are the same as each other for a reason in a process.

A barrier layer M may be disposed on the other surface of the first insulating layer 111a opposing one surface of the first insulating layer 111a in which the first wiring layer 112a is embedded, an edge region of the barrier layer M may be covered by the second insulating layer 111b, and at least portions of a surface of the barrier layer M except for the edge region may be exposed by a recess portion 110V. The barrier layer M may have a surface coplanar with a surface of the second wiring layer 112b. The recess portion 110V may penetrate through the second and third insulating layers 111b and 111c, but may not penetrate through the first insulating layer 111a. Walls of the recess portions 110V formed in the second and third insulating layers 111b and 111c may have a gradient.

When the first wiring layer 112a is embedded in the first insulating layer 111a, a step generated due to a thickness of the first wiring layer 112a may be significantly reduced, and an insulating distance of a connection member 140 may thus become constant. The first wiring layer 112a may be recessed in the first insulating layer 111a, such that a lower surface of the first insulating layer 111a and a lower surface of the first wiring layer 112a may have a step therebetween. In this case, a phenomenon in which a material of an encapsulant 130 bleeds to pollute the first wiring layer 112a may be prevented. The second and third wiring layers 112b and 112c may be disposed on a level between an active surface and an inactive surface of the semiconductor chip 120. The core member 110 may be manufactured at a sufficient thickness by a substrate process, or the like, while the connection member 140 may be manufactured at a small thickness by a semiconductor process, or the like. Therefore, a thickness of each of the wiring layers 112a, 112b, 112c, and 112d may be greater than that of the redistribution layer 142. A description of other configurations overlaps that described above, and is thus omitted.

Figure 13:
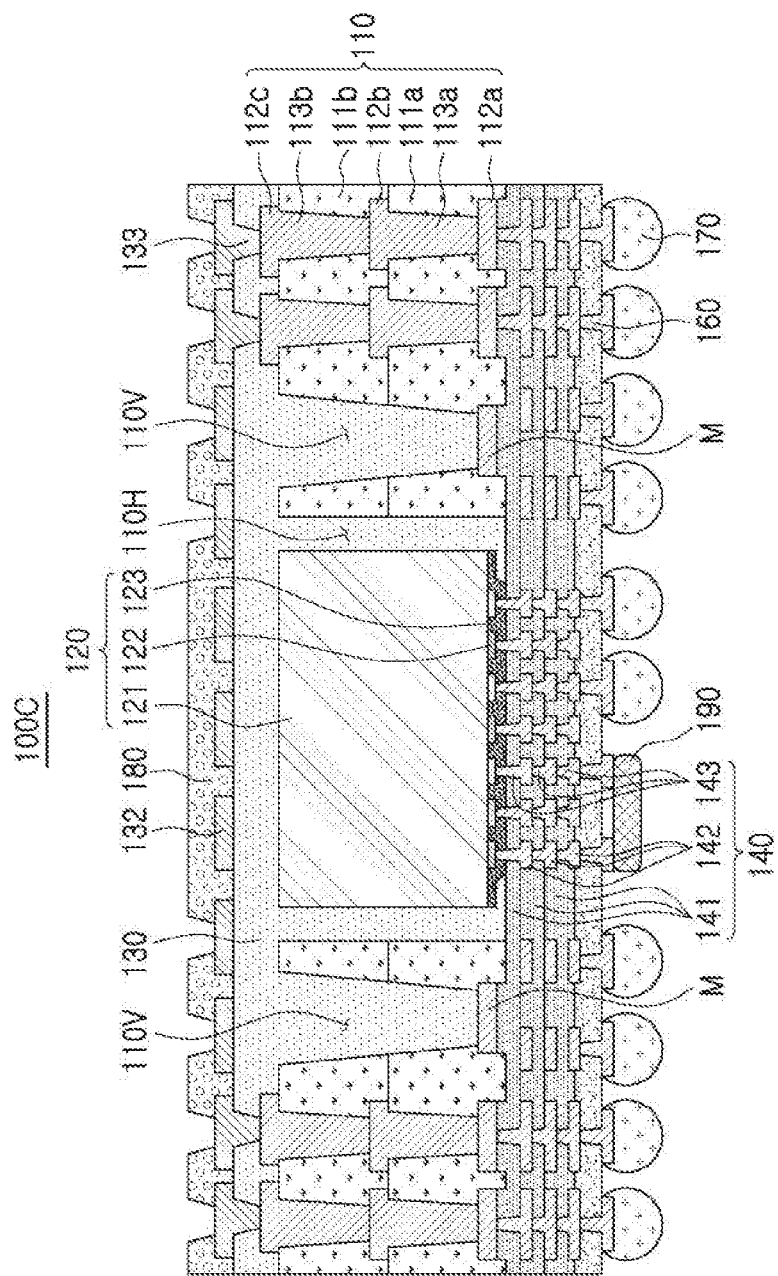
FIG. 13 is a schematic cross-sectional view illustrating another example of a fan-out semiconductor package.

FIG. 13 is a schematic cross-sectional view illustrating another example of a fan-out semiconductor package.

Referring to FIG. 13, in a fan-out semiconductor package 100C according to another exemplary embodiment in the present disclosure, a core member 110 may include a first insulating layer 111a, a first wiring layer 112a embedded in the first insulating layer 111a so that one surface thereof is exposed, a second wiring layer 112b disposed on the other surface of the first insulating layer 111a opposing one surface of the first insulating layer 111a in which the first wiring layer 112a is embedded, a second insulating layer 111b disposed on the first insulating layer 111a and covering the second wiring layer 112b, and a third wiring layer 112c disposed on the second insulating layer 111b. The first to third wiring layers 112a, 112b, and 112c may be electrically connected to each other through first and second vias 113a and 113b respectively penetrating through the first and second insulating layers 111a and 111b, and may be electrically connected to connection pads 122 through redistribution layers 142, or the like.

A material of each of the insulating layers 111a and 111b is not particularly limited. For example, an insulating material may be used as the material of each of the insulating layers 111a and 111b. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a PID resin may also be used as the insulating material.

The wiring layers 112a, 112b, and 112c may serve to redistribute the connection pads 122 of a semiconductor chip 120. A material of each of the wiring layers 112a, 112b, and 112c may be a conductive material such as copper (Cu), aluminum (Al), silver (Ag), tin (Sn), gold (Au), nickel (Ni), lead (Pb), titanium (Ti), or alloys thereof. The wiring layers 112a, 112b, and 112c may perform various functions depending on designs of corresponding layers. For example, the wiring layers 112a, 112b, and 112c may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the wiring layers 112a, 112b, and 112c may include via pads, wire pads, electrical connection structure pads, and the like.

The vias 113a and 113b may electrically connect the wiring layers 112a, 112b, and 112c formed on different layers to each other, resulting in an electrical path in the core member 110. A material of each of the vias 113a, 113b, and 113c may be a conductive material. Each of the vias 113a, 113b, and 113c may be completely filled with the conductive material, or the conductive material may also be formed along a wall of each of via holes. Meanwhile, all the vias 113a, 113b, and 113c may have tapered shapes of which directions are the same as each other for a reason in a process.

A barrier layer M may be embedded in the first insulating layer 111a so that one surface thereof is exposed. An edge region of the barrier layer M may be covered by the second insulating layer 111a, and at least portions of a surface of the barrier layer M except for the edge region may be exposed by a recess portion 110V. The recess portion 110V may penetrate through the second insulating layers 111a and 111b. Walls of the recess portion 110V formed in the second insulating layers 111a and 111b may have a gradient.

The second wiring layer 112b may be disposed on a level between an active surface and an inactive surface of the semiconductor chip 120. A thickness of each of the wiring layers 112a, 112b, and 112c may be greater than that of the redistribution layer 142. A description of other configurations overlaps that described above, and is thus omitted.

As set forth above, according to the exemplary embodiment in the present disclosure, a fan-out semiconductor package of which warpage may be effectively controlled may be provided.

While exemplary embodiments have been shown and described above, it will be apparent to those skilled in the art that modifications and variations could be made without departing from the scope of the present invention as defined by the appended claims.

What is claimed is:

1. A fan-out semiconductor package comprising:
   a core member comprising:
   a through-hole;
   a recess portion, the recess portion having a depth penetrating through the core member that is less than a depth of the through-hole penetrating through the core member; and
   a barrier layer disposed as a stopper layer of the recess portion;
   a semiconductor chip disposed in the through-hole of the core member, the semiconductor chip comprising:
   an active surface having connection pads disposed thereon; and
   an inactive surface opposing the active surface;
   an encapsulant covering at least portions of the core member and the semiconductor chip and filling at least portions of the through-hole and at least a portion of the recess portion from the barrier layer towards the inactive surface; and
   a connection member disposed on the core member and the active surface of the semiconductor chip, the connection member comprising a redistribution layer electrically connected to the connection pads,
   wherein a first surface of the recess portion is closed by the barrier layer formed in the core member and a second surface of the recess portion opposing the first surface is opened, and
   the barrier layer is a conductive layer.

2. The fan-out semiconductor package of claim 1, wherein walls of the recess portion have a gradient of an acute angle.

3. The fan-out semiconductor package of claim 1, wherein the core member further comprises a plurality of wiring layers electrically connected to the connection pads through the redistribution layer.

4. The fan-out semiconductor package of claim 3, wherein the first surface of the recess portion is closed by the barrier layer, the barrier layer having a surface coplanar with a surface of one of the plurality of wiring layers, and
   the second surface of the recess portion opposing the first surface is opened, through which the encapsulant fills the portion of the recess portion.

5. The fan-out semiconductor package of claim 3, wherein the core member further comprises:
   a first insulating layer;
   a first wiring layer disposed on a first surface of the first insulating layer; and
   a second wiring layer disposed on a second surface of the first insulating layer, wherein the first wiring layer and the second wiring layer are electrically connected to each other, and wherein the first wiring layer and the second wiring layer are electrically connected to the connection pads.

6. The fan-out semiconductor package of claim 5, wherein the core member further comprises:
   a second insulating layer disposed on the first surface of the first insulating layer and covering the first wiring layer;
   a third wiring layer disposed on the second insulating layer;
   a third insulating layer disposed on the second surface of the first insulating layer and covering the second wiring layer; and
   a fourth wiring layer disposed on the third insulating layer,
   wherein the first wiring layer, the second wiring layer, the third wiring layer, and the fourth wiring layer are electrically connected to each other, and
   wherein the first wiring layer, the second wiring layer, the third wiring layer, and the fourth wiring layer are electrically connected to the connection pads.

7. The fan-out semiconductor package of claim 6, wherein the recess portion penetrates through the first insulating layer and the third insulating layer.

8. The fan-out semiconductor package of claim 3, wherein the core member further comprises:
   a first insulating layer;
   a first wiring layer embedded in the first insulating layer so that a first surface of the first insulating layer is exposed;
   a second wiring layer disposed on a second surface of the first insulating layer opposing the first surface of the first insulating layer in which the first wiring layer is embedded;
   a second insulating layer disposed on the first insulating layer and covering the second wiring layer; and
   a third wiring layer disposed on the second insulating layer,
   wherein the first wiring layer, the second wiring layer, and the third wiring layer are electrically connected to each other, and
   wherein the first wiring layer, the second wiring layer, and the third wiring layer are electrically connected to the connection pads.

9. The fan-out semiconductor package of claim 8, wherein the recess portion penetrates through the first insulating layer and the second insulating layer.

10. The fan-out semiconductor package of claim 8, wherein the core member further comprises:
    a third insulating layer disposed on the second insulating layer and covering the third wiring layer; and
    a fourth wiring layer disposed on the third insulating layer,
    wherein the first wiring layer, the second wiring layer, the third wiring layer, and the fourth wiring layer are electrically connected to each other, and
    wherein the first wiring layer, the second wiring layer, the third wiring layer, and the fourth wiring layer are electrically connected to the connection pads.

11. The fan-out semiconductor package of claim 10, wherein the recess portion penetrates through the second insulating layer and the third insulating layer.

12. The fan-out semiconductor package of claim 3, further comprising:
    a backside wiring layer disposed on the encapsulant; and
    backside vias penetrating through at least portions of the encapsulant and connected to at least one wiring layer from among the plurality of wiring layers of the core member.

13. The fan-out semiconductor package of claim 1, further comprising:
    a passivation layer disposed on the connection member and having openings exposing at least portions of the redistribution layer of the connection member;
    underbump metal layers disposed in the openings of the passivation layer and connected to the at least portions of the redistribution layer; and
    electrical connection structures disposed on the passivation layer and connected to the underbump metal layers.

14. The fan-out semiconductor package of claim 13, further comprising a surface mounting component disposed on the passivation layer and electrically connected to the redistribution layer of the connection member.

15. The fan-out semiconductor package of claim 1, wherein a side surface of an insulating layer of the core member exposed by the recess portion is in direct contact with the encapsulant.

16. The fan-out semiconductor package of claim 1, wherein the core member further comprises a plurality of wiring layers electrically connected to the connection pads through the redistribution layer,
    wherein the first surface of the recess portion is closed by a conductive pattern electrically isolated from the plurality of wiring layers, and
    wherein the second surface of the recess portion opposing the first surface is opened, through which the encapsulant fills the portion of the recess portion.

17. The fan-out semiconductor package of claim 1, wherein the first surface of the recess portion is closed by a conductive pattern, the conductive pattern being a ground pattern or a power pattern, and
    wherein the second surface of the recess portion opposing the first surface is opened, through which the encapsulant fills the portion of the recess portion.

18. The fan-out semiconductor package of claim 1, wherein the recess portion is disposed in a region of the core member between the through-hole and a region of the core member in which a via is disposed.

* * * * *